(12) United States Patent
Eaton, Jr. et al.

(10) Patent No.: US 6,760,245 B2
(45) Date of Patent: Jul. 6, 2004

(54) MOLECULAR WIRE CROSSBAR FLASH MEMORY

(75) Inventors: James R. Eaton, Jr., Palo Alto, CA (US); Philip John Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/138,076

(22) Filed: May 1, 2002

(65) Prior Publication Data

US 2003/0206436 A1 Nov. 6, 2003

(51) Int. Cl.⁷ .......................... G11C 17/00; G11C 11/00
(52) U.S. Cl. ....................................... 365/100; 365/151
(58) Field of Search .............................. 365/100, 151, 365/153, 185.33; 257/14; 438/99, 257

(56) References Cited

U.S. PATENT DOCUMENTS

| | | | |
|---|---|---|---|
| 5,287,421 A | 2/1994 | Forrest et al. | 385/5 |
| 6,128,214 A * | 10/2000 | Kuekes et al. | 365/151 |
| 6,295,227 B1 | 9/2001 | Sakui et al. | |
| 6,300,193 B1 * | 10/2001 | Forbes | 438/257 |
| 6,432,740 B1 * | 8/2002 | Chen | 438/99 |
| 6,459,095 B1 * | 10/2002 | Heath et al. | 257/14 |
| 6,541,309 B2 * | 4/2003 | Chen | 365/151 |

OTHER PUBLICATIONS

Andrian Bachtold et al. "Logic Circuits with Carbon Nanotube Transistors." Science, vol. 294, No. 5545, pp. 1317–1320, Nov. 9, 2001.

Yu Huang et al. "Logic Gates and Computation from Assembled Nanowire Building Blocks." Science, vol. 294, No. 5545, pp. 1313–1317, Nov. 9, 2001.

Jung–Dal Choi et al. "Highly Manufacturable 1 Gb NAND Flash Using 0.12 um Process Technology." International Electron Devices Meeting Technical Digest, pp. 25–28, Dec., 2001.

Yu Huang et al—Logic Gates and Computation from Assembled Nanowire Building Blocks—Science vol. 294, No. 5545—Nov. 9, 2001—pp. 1313–1317.

* cited by examiner

*Primary Examiner*—Trong Phan (57) ABSTRACT

A nano-scale flash memory comprises: (a) source and drain regions in a plurality of approximately parallel first wires, the first wires comprising a semiconductor material, the source and drain regions separated by a channel region; (b) gate electrodes in a plurality of approximately parallel second wires, the second wires comprising either a semiconductor material or a metal, the second wires crossing the first wires at a non-zero angle over the channel regions, to form an array of nanoscale transistors; and (c) a hot electron trap region at each intersection of the first wires with the second wires. Additionally, crossed-wire transistors are provided that can either form a configurable transistor or a switch memory bit that is capable of being set by application of a voltage. The crossed-wire transistors can be formed in a crossbar array.

46 Claims, 5 Drawing Sheets

MOLECULAR WIRE CROSSBAR FLASH MEMORY

TECHNICAL FIELD

The present invention is directed generally to electronic devices whose functional length scales are measured in nanometers, and, more particularly, to configurable transistors based on crossed nanometer-scale wires. Such configurable transistors find use, for example as nanometer-scale memories, and, more particularly, as flash memories at a nanometer scale.

BACKGROUND ART

Flash memories are well-known; see, for example, a discussion of NAND flash memories by Jung-Dal Choi et al, "Highly Manufacturable 1 Gb NAND Flash Using 0.12 µm Process Technology", International Electron Devices Meeting, Dec. 2–5, 2001, as reprinted in IEDM Technical Digest, pp. 2.1.1–2.1.4. All such flash memories are fabricated at the micrometer scale, using lithographic processes. By "micrometer" scale is meant that the functional dimension is measured in micrometers (typically about 1 micrometer down to tenths of micrometers).

The density of such micrometer-scale flash memories is insufficient for ever-increasing needs for more memory in less area/volume.

Nanometer-scale memory devices are also known; see, for example, U.S. Pat. No. 6,128,214, entitled "Molecular Wire Crossbar Memory", issued to Philip J. Kuekes et al on Oct. 3, 2000, and assigned to the same assignee as the present invention, the contents of which are incorporated herein by reference.

Nanometer-scale semiconductor devices, such as field effect transistors (FETs), p-n diodes, bipolar junction transistors, and complementary inverters, are also known; see, e.g., (1) application Ser. No. 09/699,269, filed Oct. 26, 2000, now U.S. Pat. No. 6,559,468, issued May 6, 2003, which is a divisional application of application Ser. No. 09/280,188, filed Mar. 29, 1999, now abandoned, entitled "Molecular Wire Transistor (MWT)" and filed in the names of Philip J. Kuekes et al and assigned to the same assignee as the present application; Yu Huang et al, "Logic Gates and Computation from Assembled Nanowire Building Blocks", *science*, Vol. 294, Issue 5545, pp. 1313–1317 (Nov. 9, 2001); and (3) Adrian Bachtold et al, "Logic Circuits with Carbon Nanotube Transistors", *Science*. Vol. 294, Issue 5545, pp. 1317–1320 (Nov. 9, 2001). However, these references do not disclose memory devices.

Thus, there remains a need for a nano-scale flash memory, employing nano-scale transistor devices.

DISCLOSURE OF INVENTION

In accordance with the embodiments disclosed herein, a nano-scale flash memory is provided, comprising:
(a) source and drain regions in a plurality of approximately parallel first wires of nanometer-scale diameter, the first wires comprising a semiconductor material, the source and drain regions separated by a channel region;
(b) gate electrodes in a plurality of approximately parallel second wires of nanometer-scale diameter, the second wires comprising either a semiconductor material or a metal, the second wires crossing the first wires at a closest distance of nanometer scale dimensions between the second wires and the first wires, and at a non-zero angle over the channel regions, to form an array of nanoscale transistors; and
(c) a hot electron trap region, associated with each intersection of the first wires with the second wires, for controlling conductance of an associated transistor.

The disclosed embodiments solve the problem of making a flash memory at a very high density, in which the spacing between bits is on the order of a few nanometers. An extremely regular and therefore inexpensive assembly process is used.

Also in accordance with the embodiments disclosed herein, a configurable nanowire transistor is provided, comprising (a) a pair of crossed nanowires, one of the nanowires comprising a semiconductor material having a first conductivity and the other nanowire comprising either a metal or a second semiconductor material, and (b) a dielectric or molecular species to trap and hold hot electrons. The nanoscale wire transistor either forms a configurable transistor or a switch memory bit that is capable of being set by application of a voltage that is larger in absolute magnitude than any voltage at which the transistor operates. The pair of wires cross at a closest distance of nanometer scale dimensions and at a non-zero angle.

A method is provided for fabricating the nano-scale wire transistor, which comprises providing a first nano-wire, providing a second nano-wire, causing the first and second nano-wires to cross at a closest distance of nanometer scale dimensions and at a non-zero angle, and providing the hot electron trap region associated with the transistor.

Further, a crossbar array of the foregoing crossed-wire devices is provided.

BEST MODES FOR CARRYING OUT THE INVENTION

Definitions

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "configurable" means either "singly configurable" or "reconfigurable".

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference, or gap ($\Delta E_{HOMO/LUMO}$), between the HOMO and LUMO and other energetically nearby molecular orbitals is responsible for the electronic conduction properties of the molecule.

Flash Memory

Figure 1A:
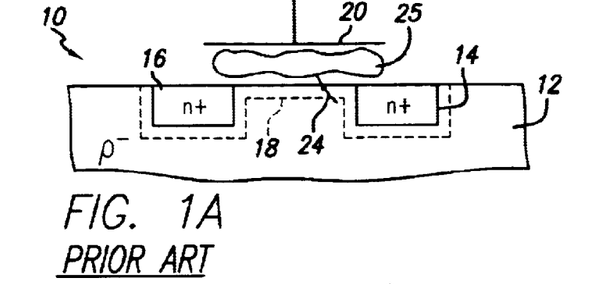
FIG. 1a is a side elevational view of one prior art embodiment of a micrometer-scale flash memory.
Figure 1B:
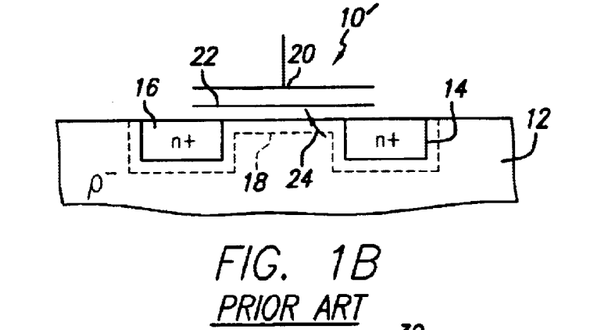
FIG. 1b is a view similar to that of FIG. 1a, but of a prior art embodiment of a micrometer-scale flash memory employing a floating gate.

Field effect transistors (FETs) are used to construct flash memories. Referring to FIGS. 1a–1b, such FETs 10, 10' comprise a substrate 12, in which are formed source regions 14 and drain regions 16. A channel region 18 extends between the source and drain regions 14, 16. As depicted in FIG. 1a, a gate 20 is used to control the flow of electrons in the channel region 18. As depicted in FIG. 1b, the gate 20 is used in combination with a floating gate 22 to control the flow of electrons. It is seen that the substrate 12 is of a first polarity, here, $p^-$, and the source and drain regions 14, 16 are of the opposite polarity, here, $n^+$.

As shown in FIGS. 1a–1b, a flash memory writes a bit by injecting "hot" electrons 24 into a trap 25, specifically, a dielectric (which may be an oxide layer), associated with the gate 20 (FIG. 1a), or onto the floating gate 22 (FIG. 1b). This injection happens when a voltage threshold is exceeded.

Figure 2:
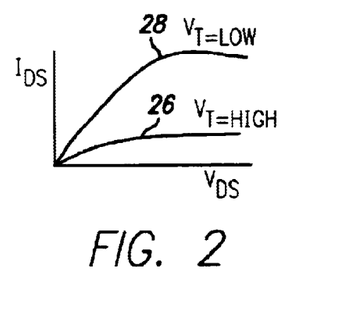
FIG. 2, on coordinates of current (I) and voltage (V), is a plot depicting the I-V characteristics of a flash memory between the gate and source.

The I-V characteristics of a flash memory are shown in FIG. 2, which shows two curves, one where $V_T$=Hi (Curve 26) and one where $V_T$=LO (Curve 28). $V_T$ is the threshold voltage on the gate at which the transistor starts to conduct. One of these curves, Curve 26, indicates that hot electrons are present. The extra charge between the gate 20, 22 and the source 14 dictates the properties of the I-V curve. More specifically, if electrons are the carriers in the transistor region (through the channel), then the presence of hot electrons is evidenced by lower Curve 26. If holes are the carriers, then the presence of hot electrons is evidenced by upper Curve 28.

Figure 3:
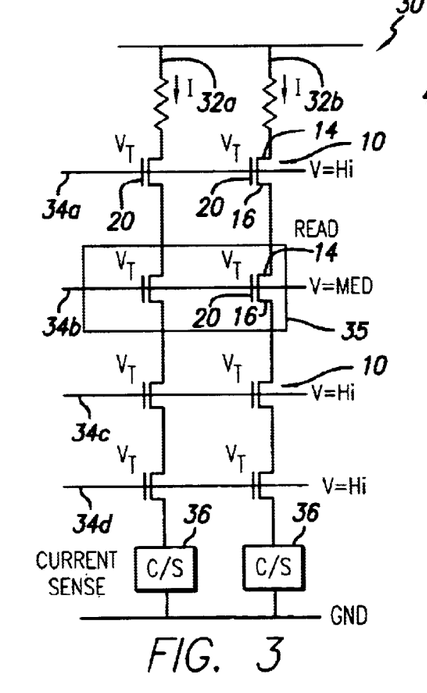
FIG. 3 is a schematic view of an array of floating-gate field-effect transistors used as a flash memory.

FIG. 3 shows an array 30 of FETs 10, with each column connected in series (the source 14 of one FET 10 connected to the drain 16 of an adjacent FET). A plurality of such parallel columns 32 (two are shown, 32a, 32b) are provided. Rows 34 (four are shown, 34a, 34b, 34c, 34d) are created by interconnecting a gate 20 of each column 32 to a gate in a neighboring column. It is to be understood that more than one bit per row may be read ("READ") simultaneously, as indicated by box 35.

The resulting bit written by injection of a hot electron may be read because of the change in the characteristic current as a function of gate voltage on the associated transistor. A specific bit in the array 30 may be read at 35 by placing a voltage V=Med (a medium voltage) on the selected row 34b and V=Hi (a higher voltage) on all other rows 34a, 34c, 34d. All the transistors in the selected column that have V=Hi applied to their gates 20 will pass current freely. The selected transistor with V=Med will pass an amount of current that is a function of the number of hot electrons trapped near its gate 20. By measuring that current with a current sense amp 36 for the selected column, shown as C/S in FIG. 3 and described as "CURRENT SENSE", then the value of the bit can be read. As in FIG. 2, $V_T$ refers to the threshold voltage of the FET.

Figure 4:
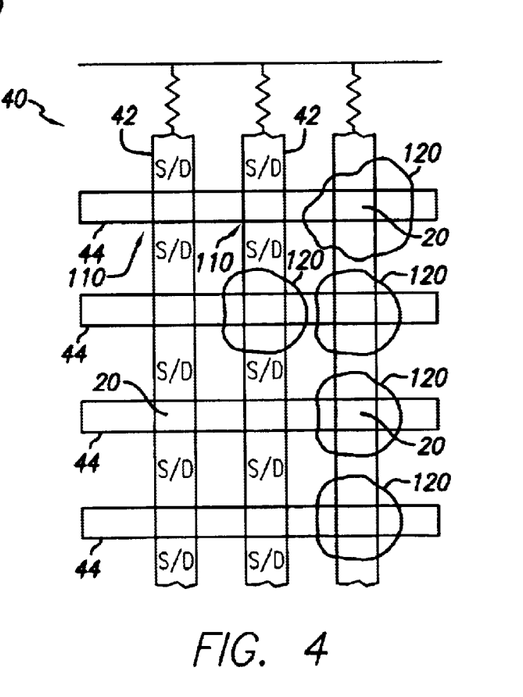
FIG. 4 is a top plan view of one embodiment of a nanometer-scale flash memory as disclosed herein.

All of the above description is true for existing flash memories. In accordance with an embodiment disclosed herein, a memory 40 is provided by crossing a plurality of approximately parallel semiconducting nanowires 42 with a plurality of approximately parallel metallic or semiconducting nanowires 44, as illustrated in FIG. 4, thereby creating source/drain ("S/D") regions of the FETs thus formed, where, as indicated for FIG. 3, the source of one FET is connected to, or forms, the drain of the FET adjacent in the column. This creates a two-dimensional array 40 of nanoscale transistors 110. Next, a hot electron trap region 120 is provided near enough to each gate 20 that it influences the switching characteristics of the transistor. This trap region 120 may be (1) a molecular species between or near the wires or (2) a dielectric layer on the wires or (3) a dielectric layer above, below, or between the wires. In any event, the trap region 120 is considered to be "associated with" the gate 20, within nanometer dimensions. The dielectric layer must include defect sites to hold charge.

One example of a molecule advantageously employed as an electron trap in practicing the embodiments disclosed herein comprises a molecule having a structure represented as

I-M-I'.

where M represents a conjugated moiety having a relatively smaller HOMO-LUMO value (to make it effectively metallic-like) and where I and I' represent an insulator portion of the molecule that is connected to the nanoscale wires 42, 44, with I and I' the same or different and having a relatively higher HOMO-LUMO value. The presence of the two insulating moieties I and I' serve to separate, and control the distance of, the M moiety from the nanoscale wires 42, 44.

I and I' must be of sufficient length and rigidity to insulate M from the electrode. As an example, I, I' is a long carbon chain moiety that is non-conjugated. Specifically, a carbon chain with greater than about 6 carbon atoms is desirably employed. Such moieties have the requisite higher $\Delta E_{HOMO/LUMO}$ value, typically on the order of 3 to 6 eV.

On the other hand, M, which exhibits metallic-like behavior, is a conjugated moiety, such as, but not limited to, a benzene ring, or two or more fused benzene rings, or polyacetylene. Such moieties have the requisite lower $\Delta E_{HOMO/LUMO}$ value, typically on the order of 1 to 2 eV.

The M moiety should be highly conjugated and relatively compact. This compactness consideration tends to favor the aromatic moieties for M over the conjugated alkyne moieties, and thus the aromatic moieties are preferred. Alkynes, being long and thus less rigid than aromatics, are more difficult to control and thus could possible short out the device. The arene rings can be in the molecular plane or perpendicular thereto. An example, depicting I=I'=$C_8$ hydrocarbon chain and two fused benzene rings, is illustrated below:

While one pair of insulating moieties is shown above, more than one such pair of insulating moieties may be present.

The exposed ends of the I moieties are attached to the electrodes 42, 44. I and I' may have appropriate end groups, such —SH, so as to attach to the electrodes 42, 44. The end groups are used as a means of controlling what part of the molecule is in contact with the electrode.

Based on the foregoing description, it is easy for one skilled in the art to construct other I-M-I' configurations that are useful in the practice of the embodiments disclosed herein.

The I–V characteristics will change, depending on the M moiety. For example, several rings can hold several electrons, compared to one ring. Thus, more rings are preferred, but, as mentioned above, the length of the rings will be a limiting factor to the number of rings. The larger the overall M moiety, the more metallic-like the molecule is in its properties. If the M moiety is relatively small, it takes a greater voltage to place an electron on it; if larger, the HOMO-LUMO gap is smaller and thus it is easier to place an electron on the M moiety. It is desirable to have more than one aromatic ring, but it is possible that with too many rings, shorting of the device could occur. The maximum length of the M moiety ultimately depends on the voltage placed on the wires 42, 44 versus how long the device is expected to last. Based on the teachings herein, such a determination is readily within the ability of the person skilled in this art.

It is also possible to stack the rings, in order to achieve a higher density of hot electron storage. For example, U.S. Pat. No. 5,287,421, the contents of which are hereby incorporated by reference, discusses the polyacenes (two or more fused benzene rings), which can be stacked, due to their planar structure.

The molecular species, such as disclosed above, can be, to a first approximation, treated as a capacitor, recognizing that an energy is required to place the electron on the M moiety, or charge the capacitor (the M moiety), which is the same as the energy required to write a bit to memory.

The energy that the hot electrons must have (how "hot" they must be) is determined by three factors. First, the electrons must have energy greater than the barrier height (in volts) of I or I'. Second, the electrons must have energy greater than the LUMO of the M moiety. Third, the electrons must have energy large enough to charge M treated as one plate of a capacitor, the other plate being the electrode that is the source of the hot electrons.

Nanoscale Wire Transistor

Another approach for constructing the nanoscale transistor that may be suitably employed herein is that taught in the above-referenced application filed in the names of Philip J. Kuekes et al and entitled "Molecular Wire Transistor", the contents of which are incorporated herein by reference. As taught in that application, FETs are fabricated using a cross-bar array, comprising a two-dimensional array of crossed wires, in which one plurality of wires comprises a semiconductor material and the other plurality of wires comprises a metal. The semiconductor wires become the transistor and the metal wires induce formation of a gate in the semiconductor wire. A molecular species at the junction of each wire pair creates a sufficient standoff distance from the metal wire to insulate it from the gate, which is formed between source and drain regions defined by the creation of the gate in the semiconductor wire.

In yet another embodiment, a memory effect (trapped hot electron considered as a configuration state) may be incorporated into the nanoscale transistor. By providing an electron trap, it then becomes possible to have a special type of transistor. The electron trap comprises either the dielectric with charge-holding defects discussed above or the molecular species discussed above.

If the configuration state is not set (no electrons in the trap), then a transistor is formed, but if the configuration state is set (electrons in the trap), then either an open or closed switch is formed. Whether a switch is open or closed depends on whether the gated region of the transistor conducts with electrons or holes. If the transistor conducts with electrons, then one or more electrons in the trap will form an open switch. If the transistor conducts with holes, then one or more electrons in the trap will form a closed switch. For such a configurable transistor or switch memory bit to be useful, the ordinary operation of the transistor should not change its configuration state. The configuration state can be set only upon application of a voltage larger in magnitude than any voltage at which the transistor operates.

In any event, in one embodiment herein, the first wires 42 and the second wires 44 each have a diameter of up to 50 nm and the second wires are separated from the first wires by a distance of up to 50 nm.

The present invention allows transistors to be formed with a size on the order of tens of nanometers to a few nanometers. By choosing a hot electron trap region, associated with each intersection of the first nanowires with the second nanowires, for controlling conductance of the associated transistor, it is possible to build transistors with a wide variety of specifically desired electrical properties. The inclusion of an electrically settable memory bit, through trapping hot electrons near the gate region, allows a new and useful function to be added to transistors.

An extremely regular and therefore inexpensive assembly process is used to form the nanowires and to form regular arrays of nanowires. For examples of such assembly processes, see the following issued patents, the contents of which are incorporated herein by reference: U.S. Pat. No. 6,128,214, entitled "Molecular Wire Crossbar Memory", issued to Philip J. Kuekes et al on Oct. 3, 2000; U.S. Pat. No. 6,248,674, entitled "Method of Aligning Nanowires", issued to Theodore I. Kamins et al on Jun. 19, 2001; U.S. Pat. No. 6,256,767, entitled "Demultiplexer for a Molecular Wire Crossbar Network (MWCN DEMUX)", issued to Philip J. Kuekes et al on Jul. 3, 2001; U.S. Pat. No. 6,294,450, entitled "Nanoscale Patterning for the Formation of Extensive Wires", issued to Yon Chen et al on Sep. 25, 2001; and U.S. Pat. No. 6,314,019, entitled "Molecular-Wire Crossbar Interconnect (MWCI) for Signal Routing and Communications", issued to Philip J. Kuekes et al on Nov. 6, 2001, all assigned to the same assignee as the present application.

Figure 5:
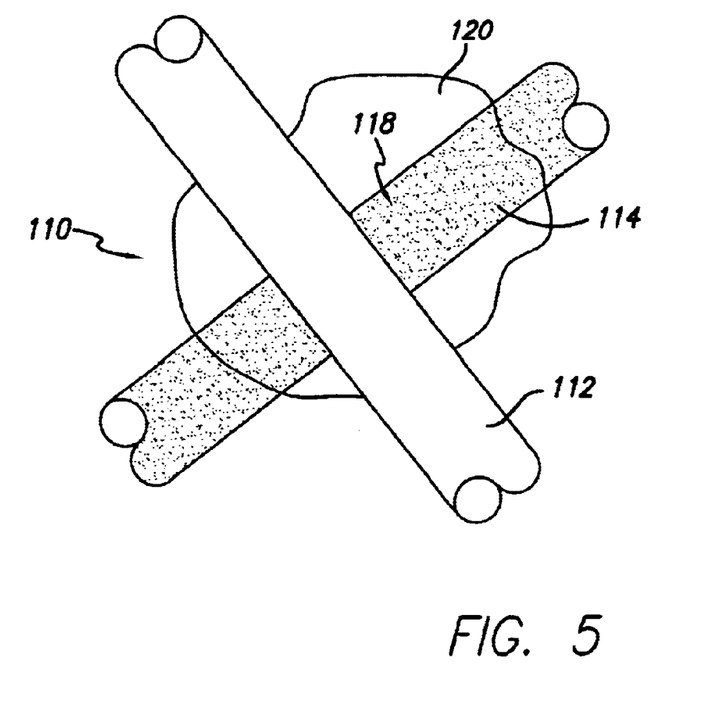
FIG. 5 is a representation of a transistor comprising a pair of crossed nano-scale wires and a hot electron trap region associated therewith.

FIG. 5 depicts a single transistor 110 comprising a pair of crossed nanoscale wires 112, 114, with the hot electron trap region 120 disposed in association with the junction 118 formed by two nano-scale wires. One of the nano-scale wires 112, 114 comprises a doped semiconductor material, while the other of the nano-scale wires 114, 112 comprises either a metal or a doped semiconductor material. If both nano-scale wires 112, 114 comprise a semiconductor material, both semiconductor materials may be of the same conductivity or opposite conductivity. The distance between the two wires is of nanometer dimensions.

Figure 5A:
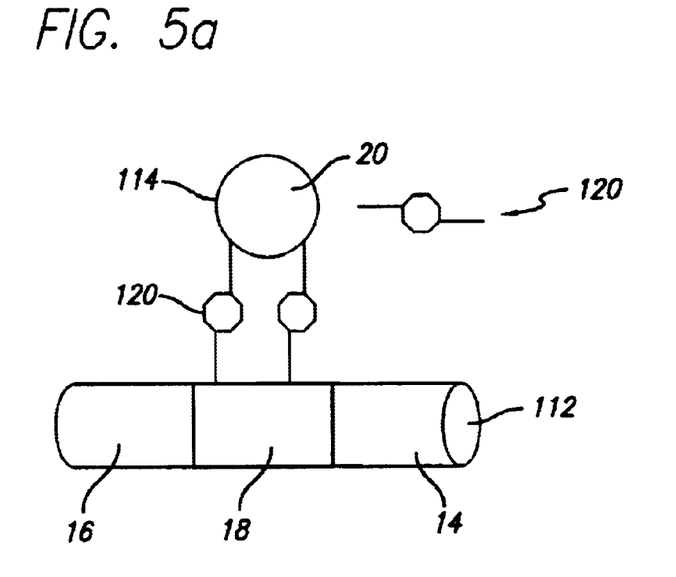
FIGS. 5a–5e are side elevational views of the transistor of FIG. 5, show various embodiments of the hot electron trap region associated with the pair of crossed wires.
Figure 5B:
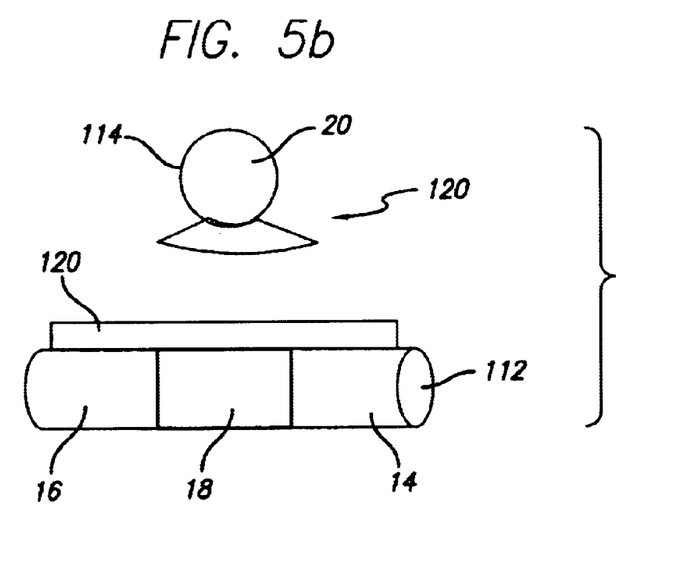
Figure 5C:
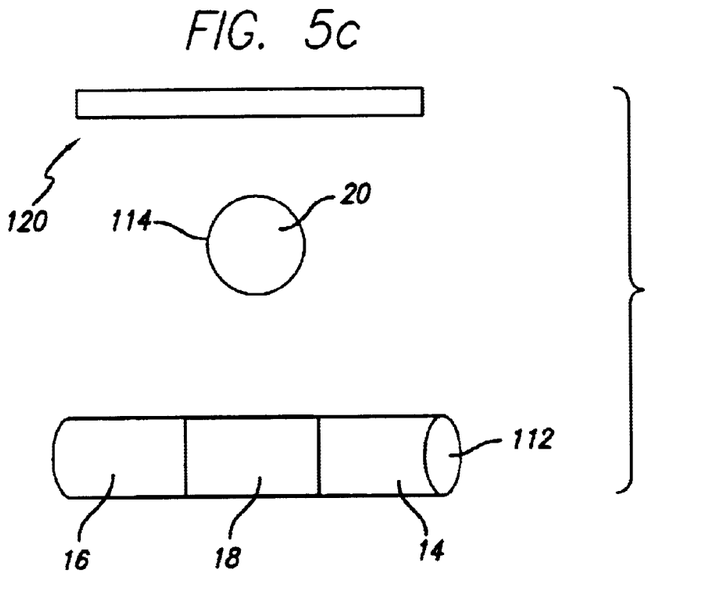
Figure 5D:
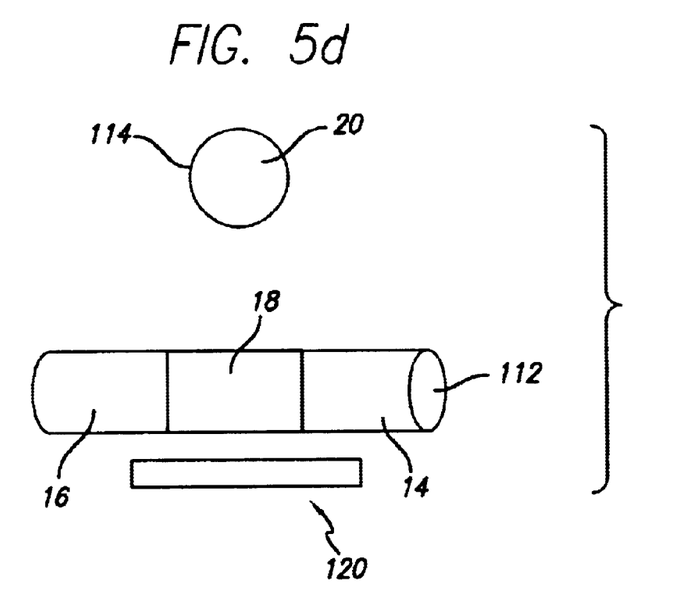
Figure 5E:
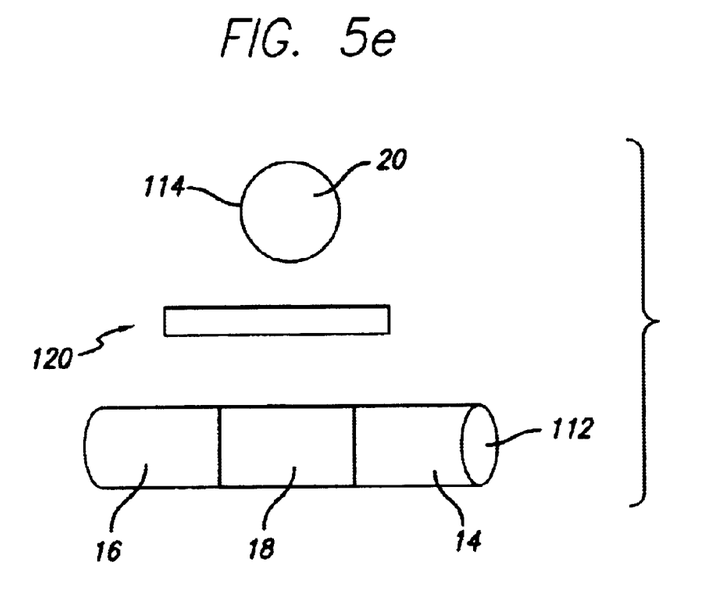

FIGS. 5a–5e depict the various embodiments of the association of the hot electron trap region 120 with the pair of crossed nano-scale wires 112, 114. As shown in FIG. 5a, the trap region 120 may be a molecular species between or near the wires 112, 114 (both configurations are shown in FIG. 5a, but only one such configuration need be used). Alternatively, the trap region 120 may comprise a dielectric layer on the wires 112, 114, as shown in FIG. 5b. Although the dielectric layer is shown on both wires, it is possible, though not shown, that the dielectric layer may be on one or the other wire. Yet alternatively, the trap region 120 may comprise a dielectric layer above the wires 112, 114 (FIG. 5c), below the wires (FIG. 5d), or between the wires (FIG. 5e). In each drawing, the source 14, drain 16, channel region 18, and gate 20 are depicted.

Crossbar Array of Crossed-Wire Transistors

Figure 6:
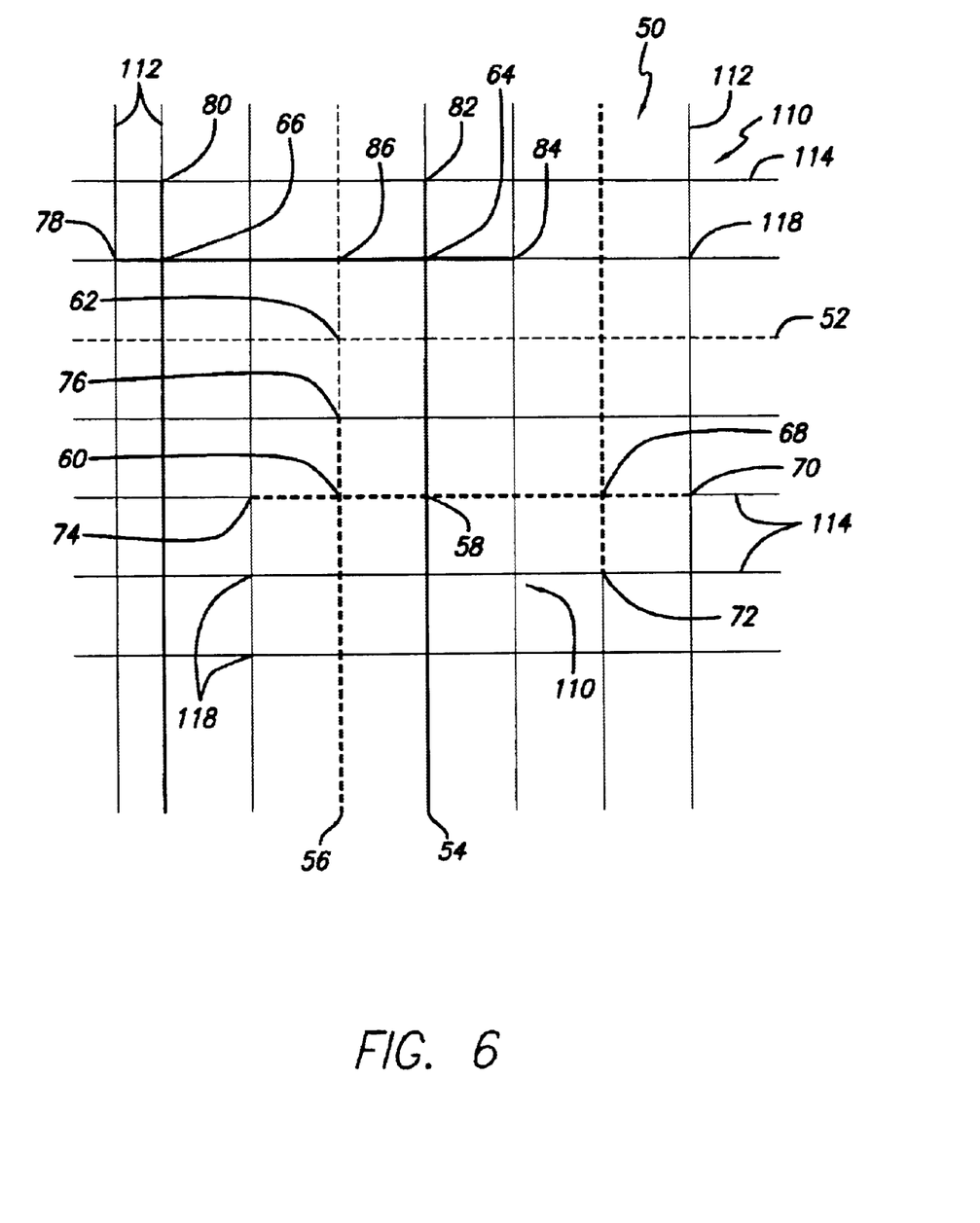
FIG. 6 is a schematic diagram depicting a crossbar interconnect and showing the features that enable construction of an arbitrarily complex integrated circuit.

FIG. 6 represents an embodiment of a crossbar 50 that employs the configurable molecular wire transistors 110 disclosed herein. The crossbar 50, which is disclosed and claimed in U.S. Pat. No. 6,314,019, entitled "Molecular-Wire Crossbar Interconnect (MWCI) for Signal Routing and Communications, issued on Nov. 6, 2001, to Philip J. Kuekes et al and assigned to the same assignee as the present application, consists of a layer of vertical nanowires 112 and a layer of horizontal nanowires 114. Junctions 118 are formed where the vertical wires 112 and the horizontal wires 114 cross. Distinct electrical nets (one indicated by dashed lines 52, one indicated by heavy solid lines 54, and one indicated by dotted lines 56) may be created in the crossbar 50 as part of an integrated circuit. These separate circuits 52, 54, 56 can cross each other without being electrically connected where a crossbar switch is open, denoted 58 (not conducting current). Alternatively, horizontal and vertical wires may be electrically connected by switches that are closed, denoted 60, 62, 64, 66, 68. Circuits may be confined to segments of horizontal or vertical crossbar wires by setting the configuration of the nanowire transistor herein to make an electrically open switch, denoted 70, 72, 74, 76, 78, 80, 82, 84. By using the nanowire transistor herein to make and break electrical connections along wires in a layer (segmented wires) and by using voltage controlled switches (electrochemical cells) formed by some pairs of crossed nanowires between wires in two layers (vias), one can create an integrated circuit of arbitrarily complex topology. The wires may connect to an electronic device (e.g., resonant tunneling diode or transistor) (not shown) external to the crossbar array 50. Alternatively two or more nets, e.g., 54, 56 may connect to an electronic device 86 (e.g., resonant tunneling diode or transistor) internal to the crossbar array 50. The electronic device, whether external or internal 86, may comprise a nanoscale configurable transistor 110 herein.

In the circuit depicted in FIG. 6, it is to be understood that all pairs of wires 112, 114 which cross will have the switch 118 between them open unless it specifically intended to be closed by the design of the integrated circuit. The freedom of a circuit designer to arbitrarily select the mixture of device types and interconnect topologies (of which FIG. 6 only shows arbitrary examples) makes the circuit valuable.

INDUSTRIAL APPLICABILITY

The nano-scale flash memory disclosed and claimed herein is expected to find use in nano-scale electronic circuits and as very high density memory.

What is claimed is:

1. A nano-scale flash memory comprising:
   (a) source and drain regions in a plurality of approximately parallel first wires of nanometer-scale diameter, said first wires comprising a semiconductor material, said source and drain regions separated by a channel region;
   (b) gate electrodes in a plurality of approximately parallel second wires of nanometer-scale diameter, said second wires comprising either a semiconductor material or a metal, said second wires crossing said first wires at a closest distance of nanometer scale dimensions between said second wires and said first wires, and at a non-zero angle over said channel regions, to form an array of nanoscale transistors; and
   (c) a hot electron trap region, associated with each intersection of said first wires with said second wires, for controlling conductance of an associated transistor.

2. The nano-scale flash memory of claim 1 wherein said hot electron trap region comprises a member selected from the group consisting of (1) a molecular species associated with said first wires and said second wires, (2) a dielectric layer on either said first wires, said second wires, or both, and (3) a dielectric layer above, below, or between said first wires and said second wires.

3. The nano-scale flash memory of claim 2 wherein said hot electron trap region comprises a molecular species configured between said first wires and said second wires.

4. The nano-scale flash memory of claim 3 wherein said molecular species comprises a molecule having the structure represented by where M represents a conjugated moiety having a relatively smaller HOMO-LUMO value and where I and I' represent an insulator portion of the molecule that is connected to said first wires and second wires, with I and I' the same or different and having a relatively higher HOMO-LUMO value.

5. The nano-scale flash memory of claim 4 wherein I, I' is a long carbon chain moiety that is non-conjugated and wherein M is a conjugated moiety.

6. The nano-scale flash memory of claim 5 wherein I, I' is a carbon chain of greater than 6 carbon atoms and has a $\Delta E_{HOMO/LUMO}$ value of about 3 to 6 eV.

7. The nano-scale flash memory of claim 5 wherein M is selected from the group consisting of a benzene ring, polyacenes, and polyacetylene and has a $\Delta E_{HOMO/LUMO}$ value of about 1 to 2 eV.

8. The nano-scale flash memory of claim 1 wherein said first wires and said second wires each have a diameter of up to 50 nm and where said second wires are separated from said first wires by a distance of up to 50 nm.

9. A nano-scale wire transistor comprising (a) a pair of crossed nanowires that form an intersection, one of said nanowires comprising a semiconductor material and another of said nanowires comprising either a metal or a second semiconductor material, said wires crossing at a closest distance of nanometer dimension therebetween and at a non-zero angle, and (b) a hot electron trap region associated with said intersection for controlling conductance of each associated transistor, thereby forming a configurable transistor or a switch memory bit that is capable of being set by application of a voltage that is larger in absolute magnitude than any voltage at which said transistor operates.

10. The nano-scale wire transistor of claim 9 wherein said hot electron trap region comprises a member selected from the group consisting of (1) a molecular species associated with said first wires and said second wires, (2) a dielectric layer on either said first wires, said second wires, or both, and (3) a dielectric layer above, below, or between said first wires and said second wires.

11. The nano-scale wire transistor of claim 10 wherein said hot electron trap region comprises a molecular species configured between said first wires and said second wires.

12. The nano-scale wire transistor of claim 11 wherein said molecular species comprises a molecule having the structure represented by where M represents a conjugated moiety having a relatively smaller HOMO-LUMO value and where I and I' represent an insulator portion of the molecule that is connected to said first wires and second wires, with I and I' the same or different and having a relatively higher HOMO-LUMO value.

13. The nano-scale wire transistor of claim 12 wherein I, I' is a long carbon chain moiety that is non-conjugated and wherein M is a conjugated moiety.

14. The nano-scale wire transistor of claim 13 wherein I, I' is a carbon chain of greater than 6 carbon atoms and has a $\Delta E_{HOMO/LUMO}$ value of about 3 to 6 eV.

15. The nano-scale wire transistor of claim 13 wherein M is selected from the group consisting of a benzene ring, polyacenes, and polyacetylene and has a $\Delta E_{HOMO/LUMO}$ value of about 1 to 2 eV.

16. The nano-scale wire transistor of claim 9 wherein said first wires and said second wires each have a diameter of up to 50 nm and where said second wires are separated from said first wires by a distance of up to 50 nm.

17. The nano-scale wire transistor of claim 9 wherein said configuration state is not set, thereby forming a transistor.

18. The nano-scale wire transistor of claim 9 wherein said configuration state is set, thereby forming either an open or closed switch.

19. The nano-scale wire transistor of claim 9 wherein both said nanowires comprise a semiconductor material and wherein both semiconductor materials have the same conductivity.

20. The nano-scale wire transistor of claim 9 wherein both said nanowire comprise a semiconductor material and wherein both semiconductor materials have the opposite conductivity.

21. A method for fabricating at least one nano-scale wire transistor comprising (a) a pair of crossed nano-wires that form an intersection, one of said nanowires comprising a semiconductor material having a first conductivity and another of said nanowires comprising either a metal or a second semiconductor material having a second and opposite conductivity, and (b) a hot electron trap region, associated with each intersection of first nanowires with second nanowires, for controlling conductance of the associated transistor, said method comprising:
(a) providing at least one first nano-wire;
(b) providing at least one second nano-wire, crossing said at least one first wire at a non-zero angle such that the shortest distance between said first wire and said second wire is of nanometer dimensions; and
(c) providing a hot electron trap region associated with said transistor.

22. The method of claim 21 wherein said hot electron trap region comprises a member selected from the group consisting of (1) a molecular species associated with said first wires and said second wires, (2) a dielectric layer on either said first wires, said second wires, or both, and (3) a dielectric layer above, below, or between said first wires and said second wires.

23. The method of claim 21 wherein said hot electron trap region comprises a molecular species configured between said first wires and said second wires.

24. The method of claim 23 wherein said molecular species comprises a molecule having the structure represented by where M represents a conjugated moiety having a relatively smaller HOMO-LUMO value and where I and I' represent an insulator portion of the molecule that is connected to said first wires and second wires, with I and I' the same or different and having a relatively higher HOMO-LUMO value.

25. The method of claim 24 wherein I, I' is a long carbon chain moiety that is non-conjugated and wherein M is a conjugated moiety.

26. The method of claim 25 wherein I, I' is a carbon chain of greater than 6 carbon atoms and has a $\Delta E_{HOMO/LUMO}$ value of about 3 to 6 eV.

27. The method of claim 25 wherein M is selected from the group consisting of a benzene ring, polyacenes, and polyacetylene and has a $\Delta E_{HOMO/LUMO}$ value of about 1 to 2 eV.

28. The method of claim 21 wherein said first wires and said second wires each have a diameter of up to 50 nm and where said second wires are separated from said first wires by a distance of up to 50 nm.

29. The method of claim 21 wherein said hot electron trap region forms a configurable transistor or a switch memory bit that is capable of being set by application of a voltage that is larger in absolute magnitude than any voltage at which said transistor operates.

30. The method of claim 29 wherein said configuration state is not set, thereby forming a transistor.

31. The method of claim 29 wherein said configuration state is set, thereby forming either an open or closed switch.

32. The method of claim 21 wherein both said nanowires comprise a semiconductor material and wherein both semiconductor materials have the same conductivity.

33. The method of claim 21 wherein both said nanowire comprise a semiconductor material and wherein both semiconductor materials have the opposite conductivity.

34. A crossbar array of crossed-wire devices, each device comprising a junction formed by a pair of crossed nanowires where one wire crosses another at a non-zero angle, said junction having a functional dimension in nanometers, wherein at least one said junction in said crossbar array comprises a molecular wire transistor comprising said pair of crossed nanowires, said pair of crossed wires comprising a first semiconductor nanowire and a second nanowire being either a metal or a semiconductor, with a hot electron trap region associated with each intersection of first nanowires with second nanowires for controlling conductance of each associated transistor, thereby forming either a configurable transistor or a switch memory bit that is capable of being set by application of a voltage that is larger in absolute magnitude than any voltage at which said transistor operates.

35. The crossbar array of claim 34 wherein said hot electron trap region comprises a member selected from the group consisting of (1) a molecular species associated with said first wires and said second wires, (2) a dielectric layer on either said first wires, said second wires, or both, and (3) a dielectric layer above, below, or between said first wires and said second wires.

36. The crossbar array of claim 34 wherein said hot electron trap region comprises a molecular species configured between said first wires and said second wires.

37. The crossbar array of claim 36 wherein said molecular species comprises a molecule having the structure represented by

I—M—I'.

where M represents a conjugated moiety having a relatively smaller HOMO-LUMO value and where I and I' represent an insulator portion of the molecule that is connected to said first wires and second wires, with I and I' the same or different and having a relatively higher HOMO-LUMO value.

38. The crossbar array of claim 37 wherein I, I' is a long carbon chain moiety that is non-conjugated and wherein M is a conjugated moiety.

39. The crossbar array of claim 38 wherein I, I' is a carbon chain of greater than 6 carbon atoms and has a $\Delta E_{HOMO/LUMO}$ value of about 3 to 6 eV.

40. The crossbar array of claim 38 wherein M is selected from the group consisting of a benzene ring, polyacenes, and polyacetylene and has a $\Delta E_{HOMO/LUMO}$ value of about 1 to 2 eV.

41. The crossbar array of claim 34 wherein said first wires and said second wires each have a diameter of up to 50 nm and where said second wires are separated from said first wires by a distance of up to 50 nm.

42. The crossbar array of claim 34 wherein said hot electron trap region forms a configurable transistor or a switch memory bit that is capable of being set by application of a voltage that is larger in absolute magnitude than any voltage at which said transistor operates.

43. The crossbar array of claim 42 wherein said configuration state is not set, thereby forming a transistor.

44. The crossbar array of claim 42 wherein said configuration state is set, thereby forming either an open or closed switch.

45. The crossbar array of claim 34 wherein both said nanowires comprise a semiconductor material and wherein both semiconductor materials have the same conductivity.

46. The crossbar array of claim 34 wherein both said nanowire comprise a semiconductor material and wherein both semiconductor materials have the opposite conductivity.

* * * * *